(12) United States Patent
Chun

(10) Patent No.: US 6,924,605 B2
(45) Date of Patent: Aug. 2, 2005

(54) COMBINATION VOLTAGE DETECTOR AND LED FLASHLIGHT

(76) Inventor: James K. Chun, 7178 NE. William Rogers Rd., Indianola, WA (US) 98342

( * ) Notice: Subject to any disclaimer, the term of this patent is extended or adjusted under 35 U.S.C. 154(b) by 0 days.

(21) Appl. No.: 10/305,492

(22) Filed: Nov. 27, 2002

(65) Prior Publication Data

US 2004/0100204 A1 May 27, 2004

(51) Int. Cl.[7] .............................................. H05B 37/00
(52) U.S. Cl. .................................... 315/241 P; 362/202
(58) Field of Search .......................... 315/241 P, 209 R; 362/201, 202, 205, 800

(56) References Cited

U.S. PATENT DOCUMENTS

| | | | |
|---|---|---|---|
| 3,828,256 A | 8/1974 | Liu | 324/133 |
| 5,103,165 A | 4/1992 | Sirattz | 324/133 |
| 5,498,934 A | 3/1996 | Nilssen | 315/224 |
| 6,168,288 B1 | 1/2001 | St. Claire | 362/184 |
| 6,231,207 B1 | 5/2001 | Kennedy et al. | 362/158 |
| 6,366,028 B1 * | 4/2002 | Wener et al. | 315/241 P |

* cited by examiner

Primary Examiner—David Vu
(74) Attorney, Agent, or Firm—Dean A. Craine

(57) ABSTRACT

A combination electric field sensor and a flashlight with at least one main LED disclosed that uses a voltage multiple circuit that enables the use of a single AA or AAA battery. The voltage multiple circuit raises the battery voltage from 1.5 volts to approximately 5 volts required to sufficiently energize the main LED. The device includes a voltage detector circuit with a sensor probe which detects the presence of an electric field when the device is placed adjacent thereto and a second LED. The second LED is connected to the voltage detector circuit and designed to flash when placed against an electric field.

14 Claims, 4 Drawing Sheets

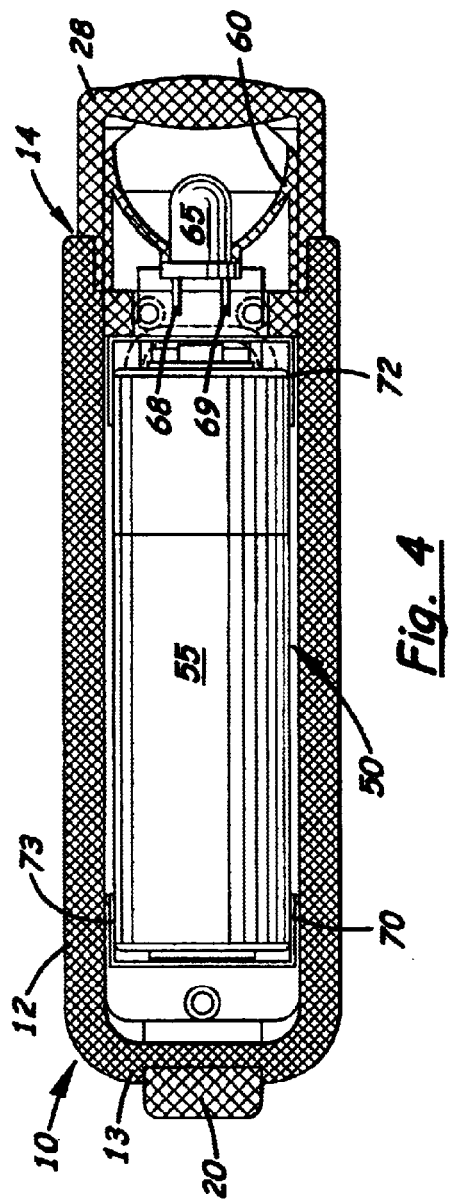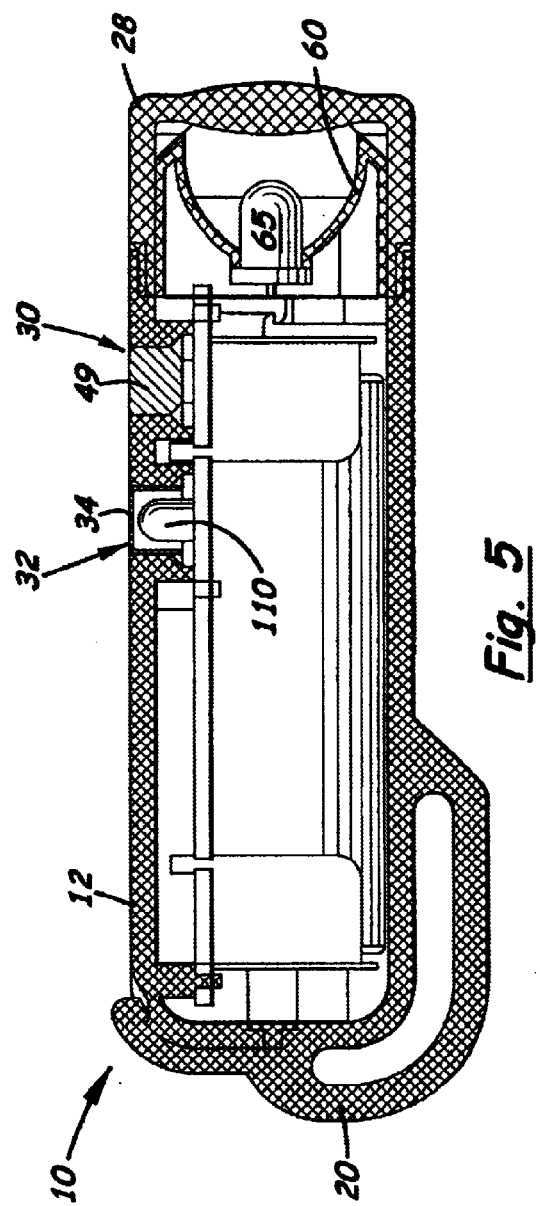

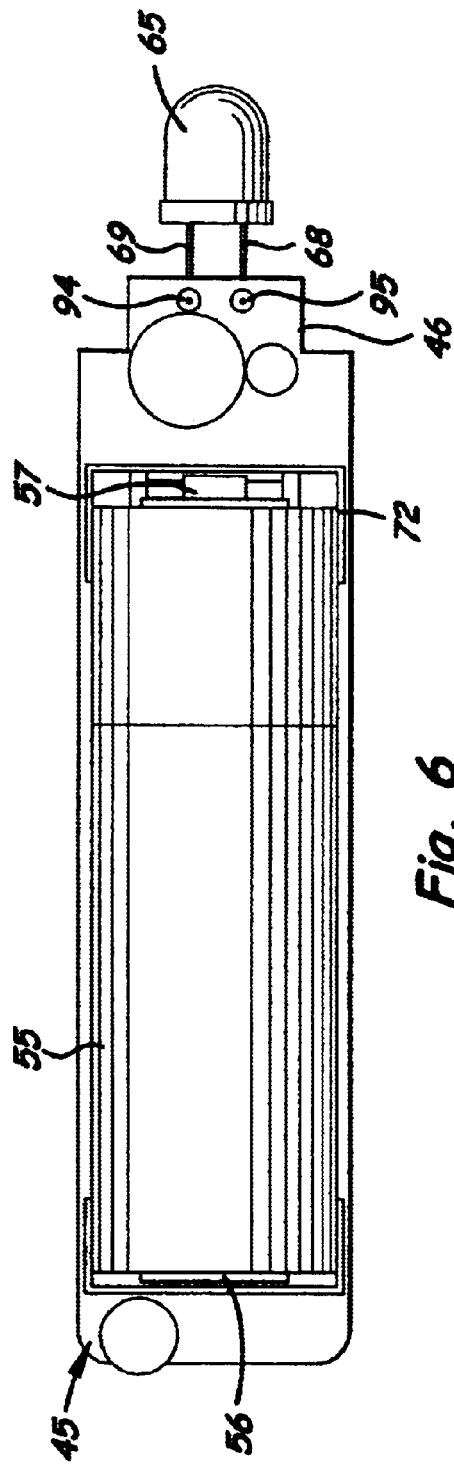
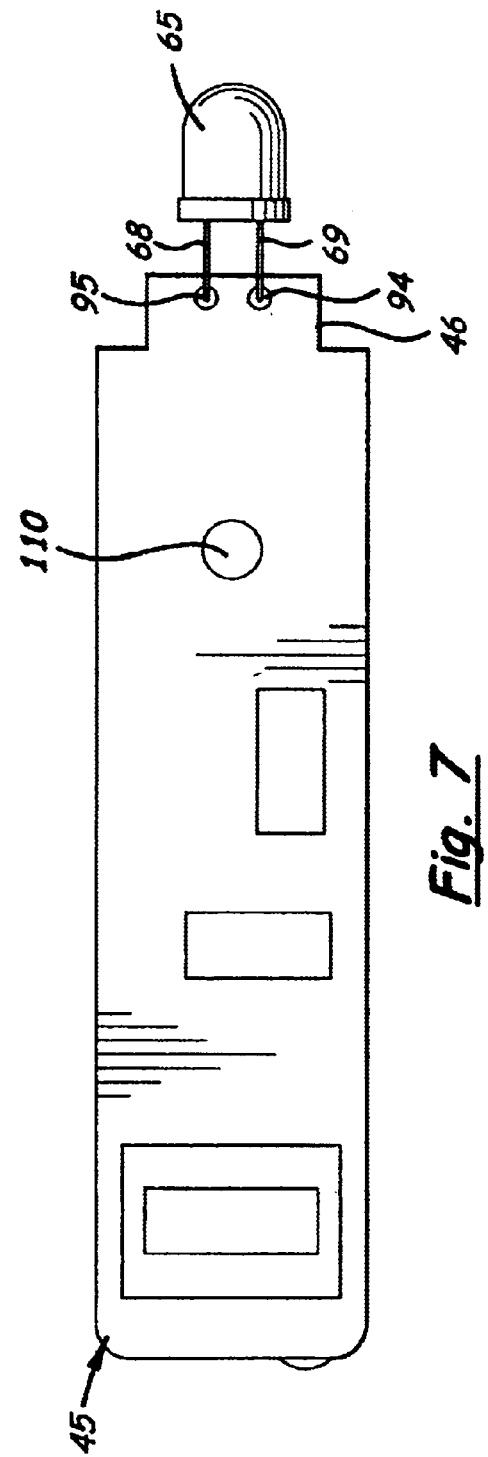

COMBINATION VOLTAGE DETECTOR AND LED FLASHLIGHT

BACKGROUND OF THE INVENTION

1. Field of the Invention

The present invention relates to voltage detectors, and more particularly, to voltage detectors that include a flashlight.

2. Description of the Related Art

Electricians commonly use a handheld, lightweight AC voltage detector to locate the hot, neutral and ground wires and terminals. An example of such a detector is sold by Fluke (Model Number 1AC and 1LAC) which is relatively small and fits into a shirt pocket. During use, the tip of the sensor glows red if a voltage is detected in a wire or terminal.

In order to make them small and lightweight for transport in a pocket, the detectors often use watch batteries. Unfortunately, watch batteries have relatively low storage capacity which severely limits their life spans. To prevent electrical shocks that may occur by using a detector with discharged batteries, many detectors include test buttons that are pressed to determine if the batteries are sufficiently charged for testing.

Many electricians work in dark environments that make it difficult to see wires and terminals. In order to test a wire or a terminal, the user must hold a flashlight or some other light source in his or her hand or mouth.

LED flashlights found in the prior art generally consist of one or more LED bulbs located inside a housing containing a plurality of batteries. Because LEDs require 5 volts of DC current for optimal illumination, at least three AA or AAA batteries connected in a series are used. As a result, most bright LED flashlights have relatively large housings. When a LED flashlight with a smaller housing is desired, for example with a LED key ring or fob, a single battery may be used, but the flashlight illumination is substantially reduced.

What is needed is a combination voltage detector and LED flashlight that is relatively small and easy to use.

SUMMARY OF THE INVENTION

It is an object of the present invention to provide a combination voltage detector and LED flashlight.

It is another object of the present invention to provide such a device that is relatively small.

It is a further object of the present invention to provide such an LED flashlight that includes a watertight housing and switches.

These and other objects are met by the combination voltage detector and LED flashlight disclosed herein that uses a LED light circuit, a power circuit, a voltage multiplying circuit, and a voltage detector circuit all mounted on a printed circuit board. The LED light circuit includes at least one main LED that optimally operates at 5.0 volts. The power circuit includes a single AA or AAA battery mounted inside the flashlight and electrically connected to the voltage multiplying circuit that raises the battery voltage from 1.5 volts to approximately 5 volts. The voltage detector circuit, which is also connected to the voltage multiplying circuit, includes a sensor probe used to detect a "live" wire or terminal and a second LED. In the preferred embodiment, the flashlight's reflector which is located inside the flashlight's front lens, acts as the sensor probe. A conductor connects the flashlight reflector to the voltage detector circuit to complete the circuit. During use, both the flashlight and voltage detector circuits are simultaneously activated when the main "ON/OFF" switch is pressed and held down by the user. When a "live" wire or terminal is detected, the second LED blinks. When the ON/OFF switch is released, both the flashlight and voltage detector circuits are simultaneously deactivated.

DESCRIPTION OF THE DRAWINGS

FIG. 4 is a sectional, top plan view of the invention.

FIG. 5 is a left side elevational view of the invention.

FIG. 6 is a left side elevational view of the battery, printed circuit board, and LED.

FIG. 7 is a right side elevational view of the printed circuit board and LED used in the invention.

DESCRIPTION OF THE PREFERRED EMBODIMENT(S)

Figure 1:
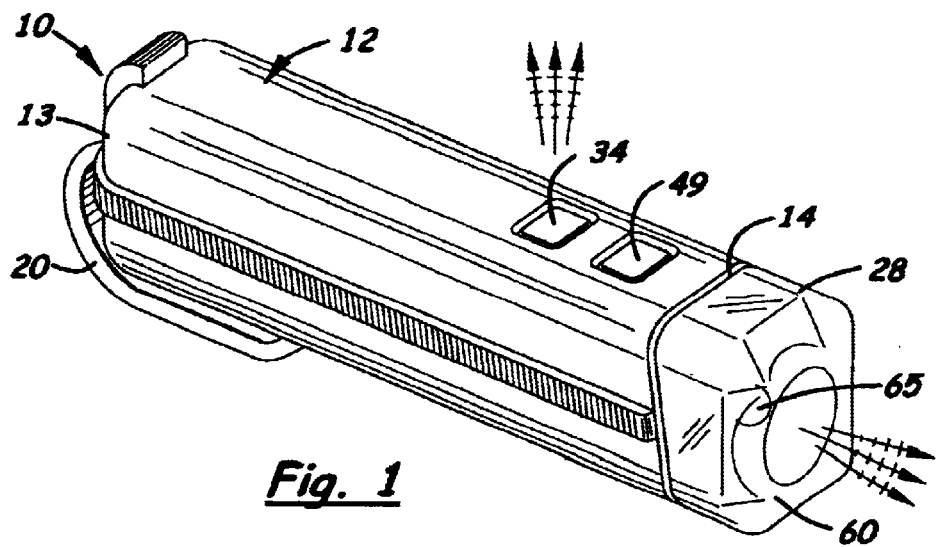
FIG. 1 is a perspective view of the combination voltage detector and LED flashlight disclosed herein.

Referring to the accompanying Figs., there is shown and described a combination voltage detector and LED flashlight, generally referred to as device 10. The device 10 includes an elongated hollow body 12, with a closed end 13 and a transparent main lens 28 that attaches over an open end 14. The body 12, which is made of a clear or colored plastic or similar material, is made of two half components 17, 18 that snap together along the body's central longitudinal axis 19. Formed on the closed end 13 of the body 12 is an optional key ring 20.

As mentioned above, attached over the open end 14 of the body 12 is a main lens 28 made of plastic or similar material. Located inside the main lens 28 is a transversely aligned chrome plated reflector 60 which acts as a sensor probe (hereinafter referred to as reflector/sensor probe 60) for the voltage detector circuit 100 discussed further below.

Figure 2:
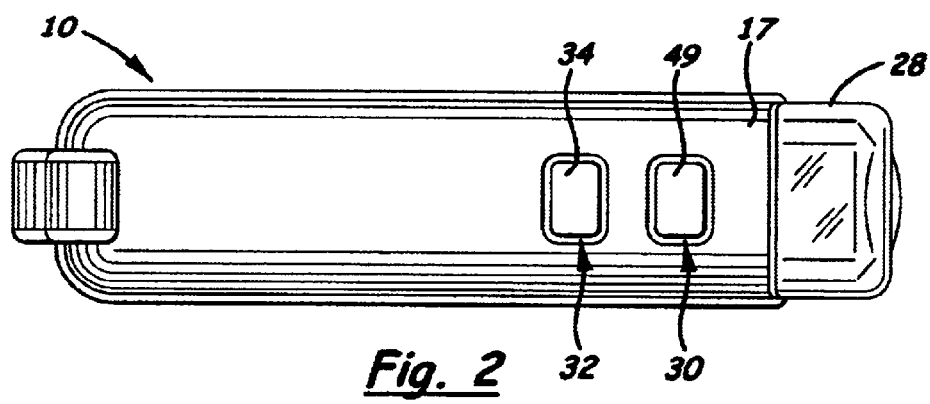
FIG. 2 is a top plan view of the invention.

As shown in FIGS. 1 and 2, formed on the outer surface of the body 12 are two holes 30, 32 through which a main ON/OFF switch button 34 and the lens 40 extend, respectively.

Shown in FIGS. 4–7, an elongated printed circuit board 45 is longitudinally aligned inside the main body 12. Longitudinally aligned and extending from the proximal end of the circuit board 45 is an integrally formed neck 46 which contains terminals 94, 95 to which the terminals 68, 69 on the flashlight's main LED 65 connect. The main printed circuit board 45 is slightly off-set from the longitudinal axis 19 of the main body 12, thereby creating a longitudinally aligned cavity 50 for a single AA or AAA battery 55.

Figure 3:
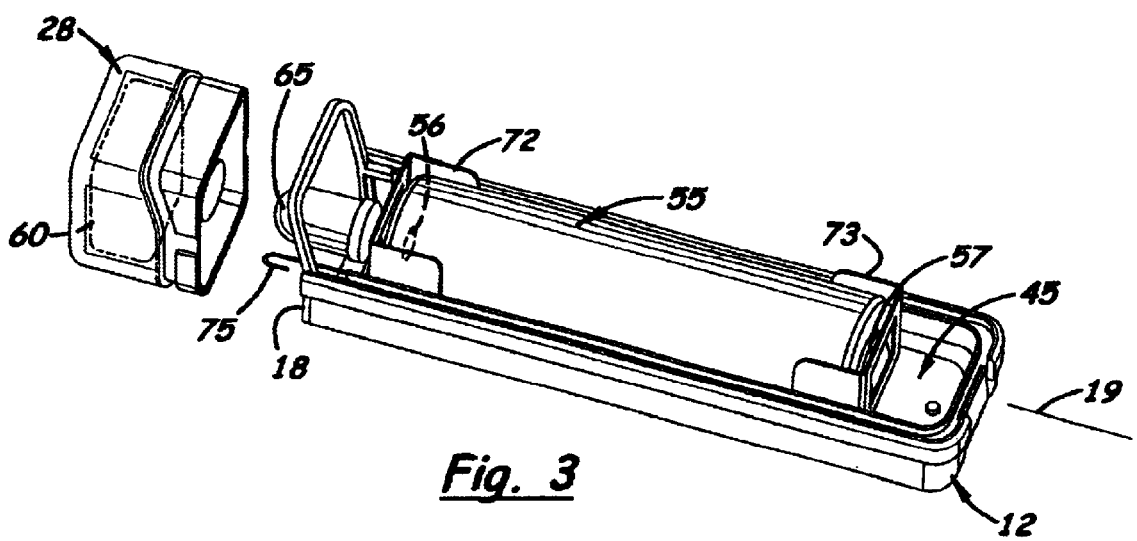
FIG. 3 is a partially exploded view of the invention.

As also shown in FIGS. 3–5, attached to the opposite ends of the printed circuit board 45 are two contact strips 72, 73 respectively, that connect to the positive and negative terminals 56, 57, respectively, on the battery 55. During assembly, a single AA or AAA battery 55 (shown) is longitudinally aligned inside the battery cavity 50 and connected between the two contact strips 72, 73. Mounted longitudinally inside the battery cavity 50 and adjacent to the battery 55 is a contact bar 75 that electrically connects the reflector/sensor probe 60 to the voltage detector circuit 100.

Figure 8:
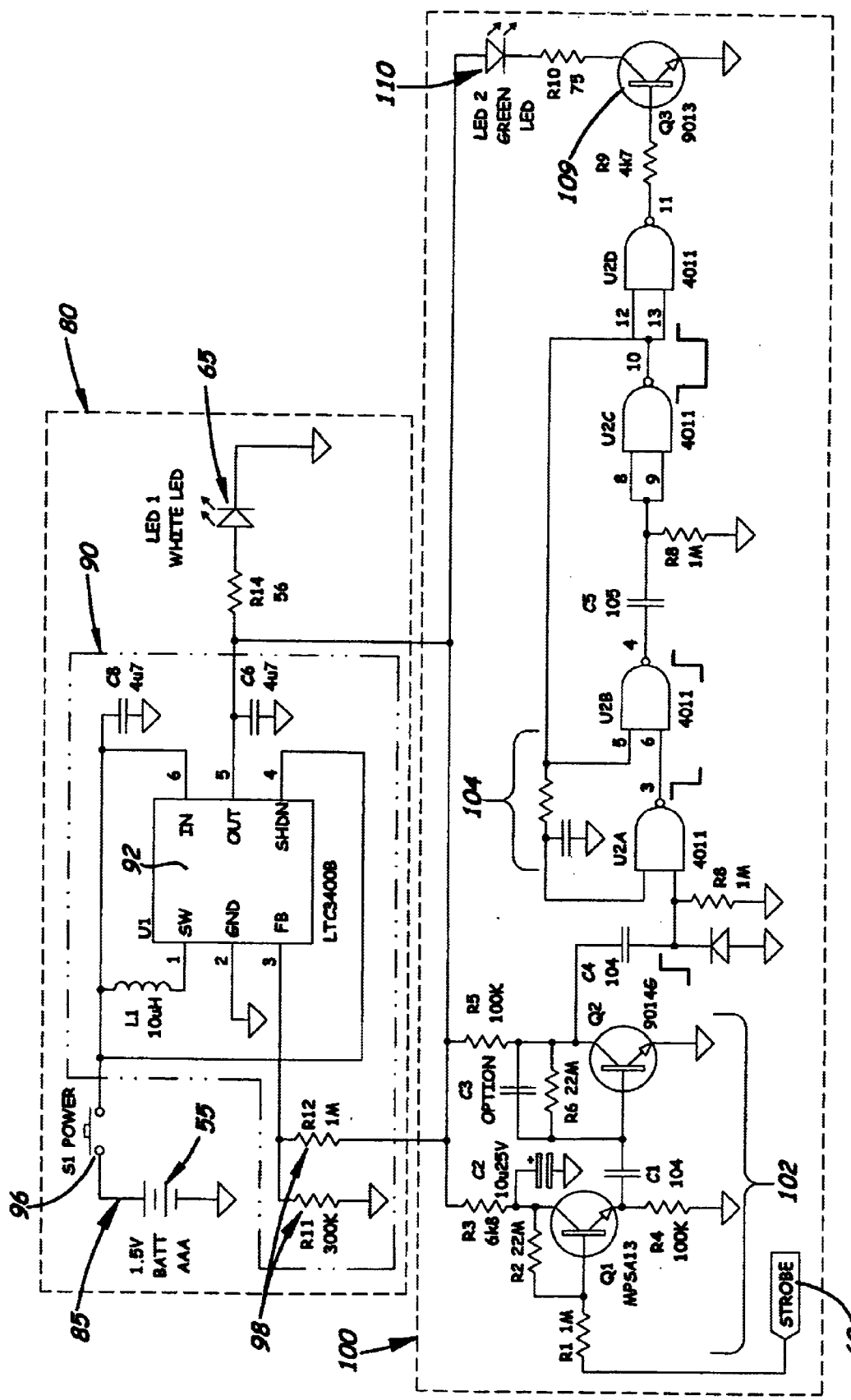
FIG. 8 is a schematic diagram of the electrical circuit used in the LED flashlight.

FIG. 8 is a schematic of the printed circuit board 45 used in the combination voltage detector and LED flashlight 10. The printed circuit board 45 includes a flashlight circuit 80, a power circuit 85, and a voltage multiplying circuit 90. The printed circuit board 45 also includes a voltage detector circuit 100 which is connected to the power circuit 85 and voltage multiplying circuit 90. The flashlight circuit 80 includes at least one main LED 65. The power circuit 85 includes a main ON/OFF switch 96 which must be continuously pressed via a button 34 to activate the power circuit 85.

The voltage multiplying circuit 90 includes a synchronous boost converter 92 that connects to the 1.5 volt battery 55 and increases its voltage. In the preferred embodiment, the synchronous boost converter 92, is a six lead thin SOT with a fixed frequency, step-up DC/DC converted capable of supplying 3.3V at 150 mA from a single AA or AAA battery 55. Such converters contain an internal NMOS switch and a PMOS synchronous rectifier. An example of a synchronous boost converter (Model No. LTC 3490) that may be used is sold by Linear Technology Corporation located in Milpitas, Calif.

The voltage detector circuit 100 is connected to the voltage multiply circuit 90 through an output voltage setting line 98. The voltage detector circuit 100 includes a reflector/sensor probe 60 designed to receive an EMF signal, an amplifier 102 designed to increase the EMF signal received by the reflector/sensor probe 60. A second LED switch control means (called a "HOLD OFF" switch) 104 is designed to control the blinking function of the driver 109 and second LED 110. As stated above, the voltage detector circuit 100 is electrically connected to the power circuit 85 and the voltage multiplying circuit 90. During use, the AA or AAA battery 55 is placed inside the battery cavity 50. The main lens 28 is then placed over the reflector/sensor probe 60 thereby preventing the reflector/sensor probe 60 from contacting a "live" wire or terminal. The main ON/OFF switch 96 is then pressed and held to activate the power circuit 85, flashlight circuit 80, and the voltage detector circuit 100. The main LED 65 is illuminated to find the wire, terminal, or area to be tested. The main lens 28 is then placed adjacent (0–10 cm) to a wire, terminal, or area. When a "live" wire or terminal is detected, the second LED 110 begins to blink. Because the flashlight circuit 80 and voltage circuit 100 are both connected to the power circuit 85, activation of the main LED 65 automatically informs the user that sufficient electrical energy is provided to the voltage detector circuit 100.

Table 1 lists the codes, names, and functions of the components shown in FIG. 8.

In compliance with the statute, the invention described herein has been described in language more or less specific as to structural features. It should be understood, however, that the invention is not limited to the specific features shown, since the means and construction shown, is comprised only of the preferred embodiments for putting the invention into effect. The invention is therefore claimed in any of its forms or modifications within the legitimate and valid scope of the amended claims, appropriately interpreted in accordance with the doctrine of equivalents.

TABLE 1

| Designators | Qty | Description |
| --- | --- | --- |
| C1 | 1 | Miniature Electrolytic Capacitor |
| C2 | 1 | Chip Capacitor |
| C3 | 1 | Chip Capacitor |
| C4 | 1 | Chip Capacitor |
| C5 | 1 | Miniature Electrolytic Capacitor |
| C6 | 1 | Chip Capacitor |
| C8 | 1 | Chip Capacitor |
| C9 | 1 | Chip Capacitor |
| D1 | 1 | Schottky Barrier Rectifier |
| D2 | 1 | "n" |
| LED1, LED2 | 2 | Nichia White LED Lamp |
| Q1 | 1 | NPN Transistor |
| Q2 | 1 | NPN Transistor |
| Q3 | 1 | NPN Transistor |
| R1 | 1 | Chip Resistor |
| R10 | 1 | Chip Resistor |
| R11 | 1 | Chip Resistor |
| R12 | 1 | Chip Resistor |
| R13 | 1 | Chip Resistor |
| R14 | 1 | Chip Resistor |
| R15 | 1 | Chip Resistor |
| R2 | 1 | Chip Resistor |
| R3 | 1 | Chip Resistor |
| R4 | 1 | Chip Resistor |
| R5 | 1 | Chip Resistor |
| R6 | 1 | Chip Resistor |
| R7 | 1 | Chip Resistor |
| R8 | 1 | Chip Resistor |
| R9 | 1 | Chip Resistor |
| PCB | 1 | Printed Circuit Board |
| U1 | 1 | Synchronous Boost Converter |
| U2 | 1 | CMOS Quad 2-input NAND gate |

I claim:

1. A combination voltage detector and LED flashlight, comprising,
   a. a hollow main body;
   b. a main lens attached to said main body;
   c. a printed circuit board disposed inside said main body, said printed circuit board including a power circuit, a voltage multiplier circuit that multiplies the voltage delivered to said power circuit, and a voltage detector circuit;
   d. at least one main LED connected to said printed circuit board and mounted under said main lens;
   e. a voltage sensor probe connected to said voltage detector circuit;
   f. a second LED connected to said voltage detector circuit;
   g. an ON-OFF switch connected to said printed circuit board to selectively activate and deactivate said power circuit, and said voltage detector circuit;
   h. a battery connected to said printed circuit board and used to energize said power circuit and said voltage detector circuit.

2. The combination voltage detector and LED flashlight as recited in claim 1, wherein said voltage multiplier circuit includes a synchronous boost converter.

3. The combination voltage detector and LED flashlight as recited in claim 2, wherein said synchronous boost converter is capable of supplying up to 5.0 volts at 150 MA.

4. The combination voltage detector and LED flashlight as recited in claim 3, wherein said battery supplies 1.5 Volts.

5. The combination voltage detector and LED flashlight, as recited in claim 1, wherein said sensor probe is an electrically conductive reflector located inside said main lens and around said main LED.

6. The combination voltage detector and LED flashlight, as recited in claim 5, wherein said reflector is electrically conducted to said voltage detection circuit on said printed circuit board.

7. The combination voltage detector and LED flashlight as recited in claim 6 wherein said voltage multiplier circuit includes a synchronous boost converter.

8. The combination voltage detector and LED flashlight as recited in claim 7, wherein said synchronous boost converter is capable of supplying up to 5.0 volts at 150 MA.

9. The combination voltage detector and LED flashlight, as recited in claim 1, wherein said battery is longitudinally aligned inside said main body.

10. The combination voltage detector and LED flashlight, as recited in claim 9, wherein said second LED is mounted on said main body.

11. A flashlight comprising:
  a. a main body;
  b. a transparent main lens attached to one end of said main body;
  c. a printed circuit board disposed inside said main body, said printed circuit board including a power circuit, a voltage multiplier circuit that triples the voltage delivered to said power circuit, and a voltage detector circuit;
  d. at least one main LED connected to said voltage multiplier circuit;
  e. a sensor probe located inside said main lens and connected to said printed circuit board;
  f. an ON-OFF switch connected to said power circuit on said printed circuit board; and;
  g. a battery connected to said power circuit and used to energize said main LED.

12. The combination flashlight as recited in claim 11, wherein said sensor probe is a reflector located inside said main lens.

13. The combination voltage detector LED flashlight, as recited in claim 12, wherein said voltage detector circuit inactivates a second LED when no voltage is detected and activates said second LED when a voltage is detected.

14. The combination voltage detector LED flashlight, as recited in claim 13, wherein said second LED blinks when a voltage is detected.

\* \* \* \* \*